(12) United States Patent
Oka et al.

(10) Patent No.: US 8,741,695 B2
(45) Date of Patent: Jun. 3, 2014

(54) SEMICONDUCTOR DEVICE AND METHOD OF MANUFACTURING THE SAME

(75) Inventors: Seiji Oka, Tokyo (JP); Kazuhiro Tada, Tokyo (JP); Hiroshi Yoshida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/619,353

(22) Filed: Sep. 14, 2012

(65) Prior Publication Data

US 2013/0181225 A1   Jul. 18, 2013

(30) Foreign Application Priority Data

Jan. 16, 2012   (JP) .................................. 2012-005906

(51) Int. Cl.
*H01L 23/48*      (2006.01)
*H01L 23/495*     (2006.01)
*H01L 33/48*      (2010.01)
*H01L 33/56*      (2010.01)

(52) U.S. Cl.
USPC ........... 438/124; 438/114; 438/121; 438/127; 257/691; 257/693; 257/698

(58) Field of Classification Search
USPC .................................................. 438/113, 114
See application file for complete search history.

(56) References Cited

U.S. PATENT DOCUMENTS

| | | | |
|---|---|---|---|
| 6,649,445 B1 | 11/2003 | Qi et al. | |
| 2009/0091039 A1* | 4/2009 | Akahoshi | ...................... 257/773 |
| 2009/0189258 A1 | 7/2009 | Mariani et al. | |
| 2010/0013086 A1 | 1/2010 | Obiraki et al. | |
| 2010/0117219 A1* | 5/2010 | Oka et al. | ...................... 257/693 |

FOREIGN PATENT DOCUMENTS

| | | | | |
|---|---|---|---|---|
| DE | 10 2009 006 580 A1 | 7/2009 | | |
| JP | 2002-110885 A | 4/2002 | | |
| JP | 2002-110888 A | 4/2002 | | |
| JP | 2002-313994 | * 10/2002 | .............. | H01L 23/12 |
| JP | 2003-318334 A | 11/2003 | | |

OTHER PUBLICATIONS

An Office Action issued by the German Patent Office on Jan. 2, 2014, which corresponds to German Patent Application No. 10 2012 222 252.9 and is related to U.S. Appl. No. 13/619,353; with English language translation.

* cited by examiner

*Primary Examiner* — Zandra Smith
*Assistant Examiner* — Pamela E Perkins
(74) *Attorney, Agent, or Firm* — Studebaker & Brackett PC

(57) ABSTRACT

A semiconductor device includes a metal substrate including a metal base plate, an insulating sheet located on the metal base plate, and a wiring pattern located on the insulating sheet, and a semiconductor element located on the metal substrate. The semiconductor element is sealed with a molding resin. The molding resin extends to side surfaces of the metal substrate. On the side surfaces of the metal substrate, the insulating sheet and the wiring pattern are not exposed from the molding resin, whereas the metal base plate includes a projecting portion exposed from the molding resin.

5 Claims, 10 Drawing Sheets

F I G . 5
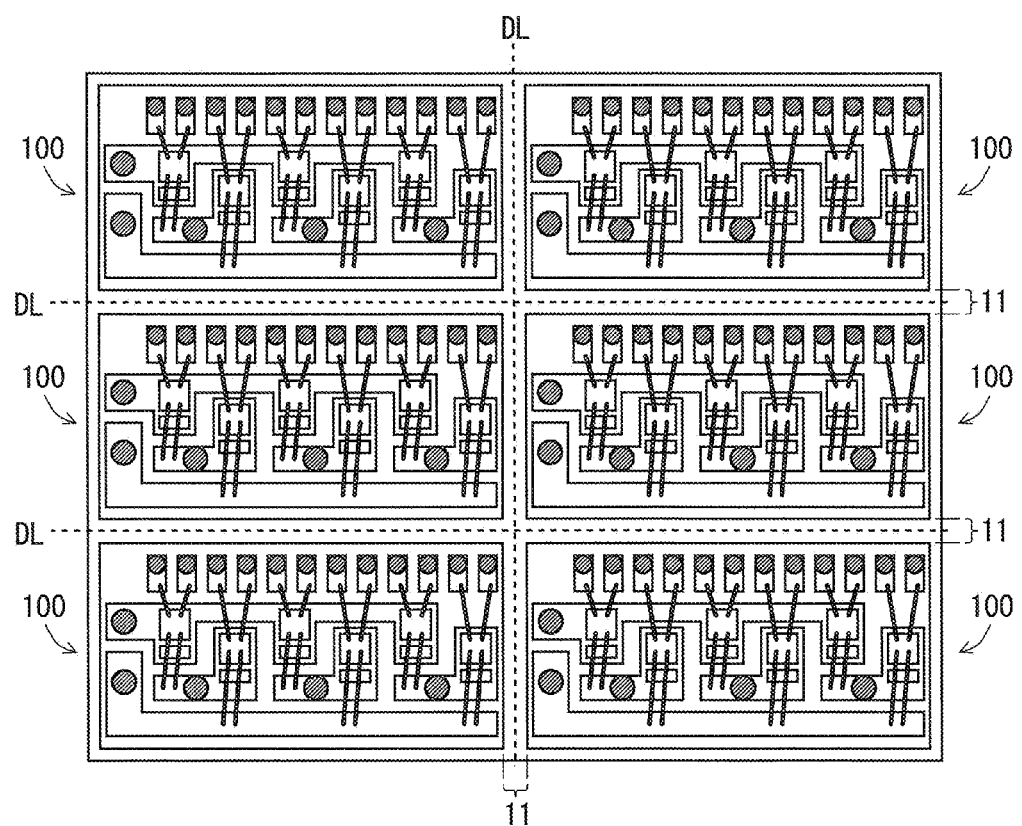

F I G . 7
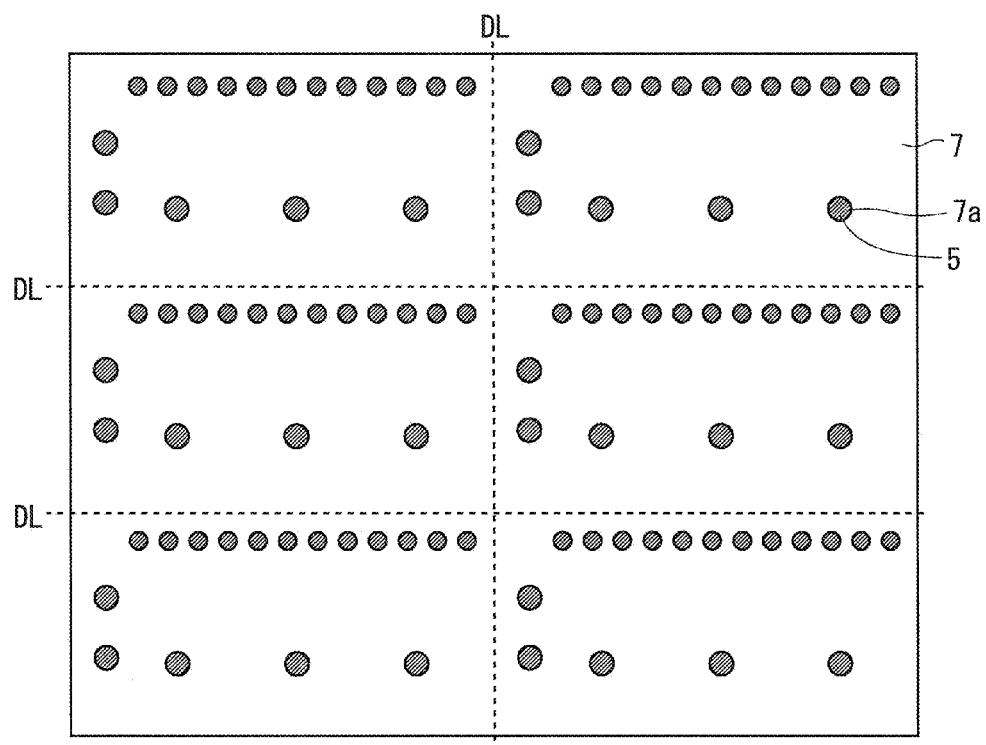

SEMICONDUCTOR DEVICE AND METHOD OF MANUFACTURING THE SAME

BACKGROUND OF THE INVENTION

1. Field of the Invention

The present invention relates to the structure of a semiconductor device and a method of manufacturing the same, and more particularly, to a semiconductor device manufactured by a batch transfer molding process.

2. Description of the Background Art

As the method of manufacturing a power semiconductor device, a batch transfer molding process is known in which a plurality of resin-sealed semiconductor devices are collectively formed and then cut (diced) to obtain individual resin-sealed semiconductor devices. The batch transfer molding process enables to improve the reliability of a power semiconductor device and reduce the size and cost thereof.

For example, Japanese Patent Application Laid-Open No. 2002-110885 discloses the method of manufacturing semiconductor devices having a lead frame structure by a batch transfer molding process. Japanese Patent Application Laid-Open No. 2002-110885 describes the technology of providing line-shaped trenches along the dicing lines in the lead frame before cutting a plurality of semiconductor devices that are collectively resin-sealed into pieces through dicing (singulation). This technology lowers the heat generated due to friction in dicing and reduces the occurrence of "burrs" on the cut surface of the lead frame.

In Japanese Patent Application Laid-Open No. 2002-110885, the line-shaped trenches are provided in the lead frame for obtaining advantages in processing, such as ease of cutting and improvement in processing accuracy. According to Japanese Patent Application Laid-Open No. 2002-110885, as shown in FIG. 1, terminal portions cut out from a lead frame are exposed from a molding resin on end surfaces (cut surfaces) of the singulated semiconductor device. Normally, in a semiconductor device having a lead frame structure, a molding resin serves exclusively to insulate terminal portions. Accordingly, with such a configuration, when moisture infiltrates from an interface between the terminal portion exposed at the edge of the semiconductor device and the molding resin, the insulating property of the molding resin may be degraded. The interface peels off in some cases, which may make the package open.

In particular a power semiconductor device is required to withstand high voltage as well as high current, and thus, the reliability of the power semiconductor device may be degraded with the structure in which terminal portions are exposed on the end surfaces of the semiconductor device.

SUMMARY OF THE INVENTION

An object of the present invention is to improve the reliability of a semiconductor device manufactured by a batch transfer molding process.

A semiconductor device according to the present invention includes: a substrate including a metal base plate, an insulating sheet located on the metal base plate, and a wiring pattern located on the insulating sheet; a semiconductor element located on the substrate; and a molding resin forming a housing for sealing the semiconductor element. The molding resin extends to side surfaces of the substrate. The insulating sheet and the wiring pattern are not exposed from the molding resin on the side surfaces of the substrate. The metal base plate includes a projecting portion exposed from the molding resin on the side surfaces of the substrate.

A method of manufacturing a semiconductor device according to the present invention includes the following steps (a) to (d). In the step (a), a substrate including a metal base plate, an insulating sheet disposed on the metal base plate, and a wiring pattern disposed on the insulating sheet is prepared. In the step (b), semiconductor elements are mounted on the substrate. In the step (c), a molding resin covering the semiconductor elements is formed on the substrate. In the step (d), after the step (c), the molding resin and the substrate are cut to cut out a plurality of semiconductor devices on which the semiconductor element is mounted. A trench is pre-formed in the substrate so as to extend along a cutting line in the step (d), the trench being larger in width than the cutting line and passing through the wiring pattern and the insulating sheet into the metal base plate. In the step (c), the molding resin is filled inside the trench.

According to the present invention, the insulating sheet and the wiring pattern are not exposed on the end surfaces of the semiconductor device, which prevents the degradation of the insulating sheet due to infiltration of moisture as well as peeling-off of the wiring pattern from the molding resin, leading to an improvement in reliability of the semiconductor device. In addition, the semiconductor device is formed by a batch transfer molding process, leading to reductions of its size and cost.

BRIEF DESCRIPTION OF THE DRAWINGS

FIGS. 5 to 8 are views for describing a method of manufacturing the semiconductor device according to the first preferred embodiment;

DESCRIPTION OF THE PREFERRED EMBODIMENTS

First Preferred Embodiment

Figure 1:
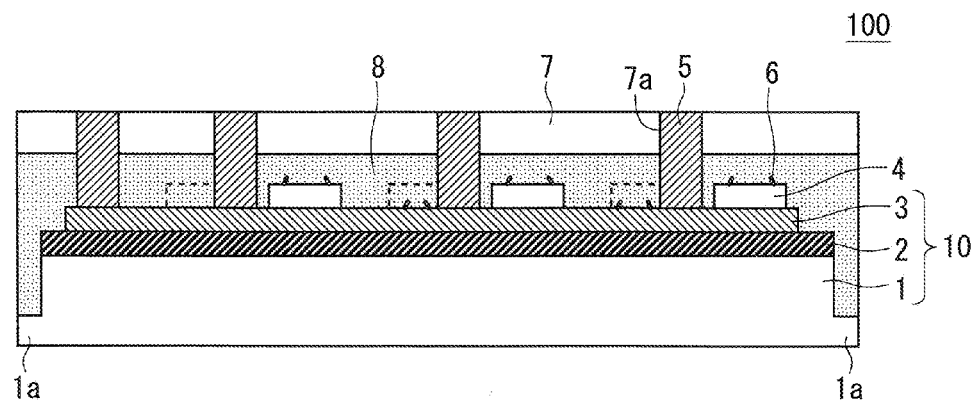
FIG. 1 is a cross-sectional view of a semiconductor device according to a first preferred embodiment.
Figure 2:
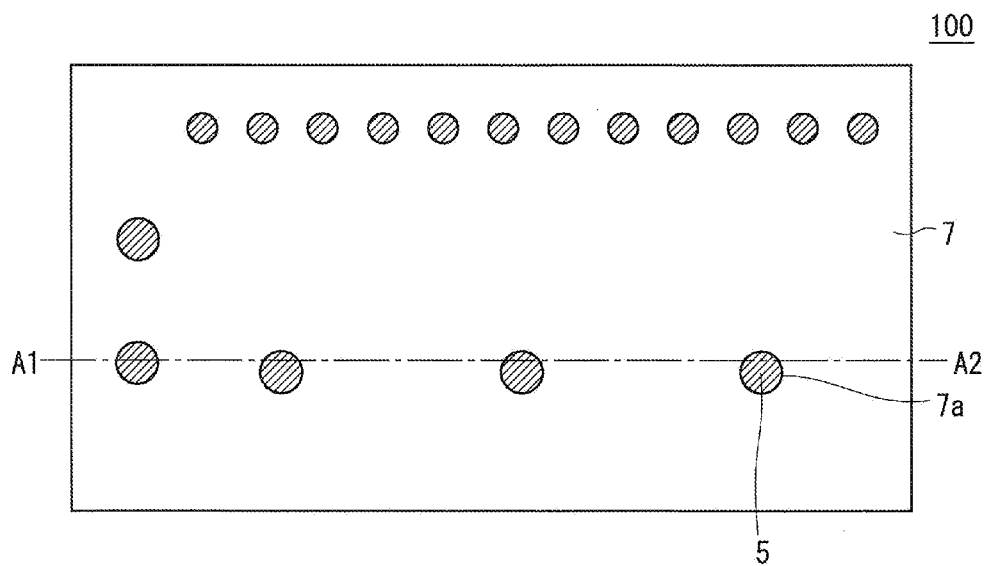
FIG. 2 is a top view of the semiconductor device according to the first preferred embodiment.
Figure 3:
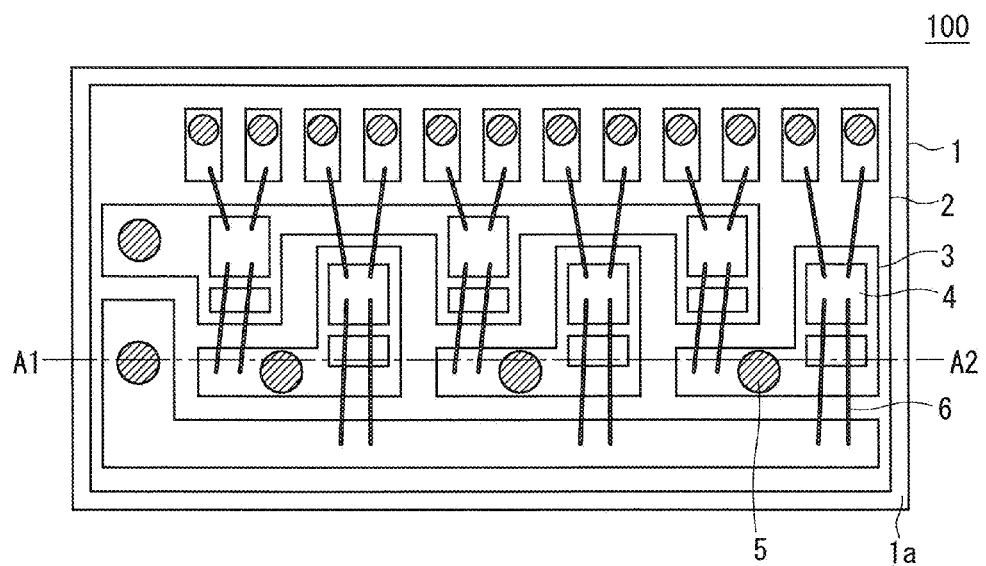
FIG. 3 is a plan view showing the internal structure of the semiconductor device according to the first preferred embodiment.

FIGS. 1 to 3 are views showing the configuration of a semiconductor device 100 according to a first preferred embodiment of the present invention. A power semiconductor device is described here as an example thereof. FIG. 1 is a cross-sectional view of the semiconductor device 100, and FIG. 2 is a top view thereof, FIG. 3 is a view showing the internal structure of the semiconductor device 100, which is a plan view of the semiconductor device 100 in which a sleeve board 7 and a molding resin 8 described below are not shown. FIG. 1 corresponds to the cross section taken along a line A1-A2 shown in FIGS. 2 and 3.

The semiconductor device 100 according to this preferred embodiment includes a metal substrate 10 composed of a metal base plate 1, an insulating sheet 2 disposed on the metal base plate 1, and a wiring pattern 3 disposed on the insulating sheet 2. Mounted on the wiring pattern 3 of the metal substrate 10 are power semiconductor elements 4 and external terminal communication parts 5 being conductive members for electrical conduction between the wiring pattern 3 and the outside. The wiring pattern 3, the semiconductor elements 4, and the external terminal communication parts 5 are connected to each other by means of wire bonds 6.

On the metal substrate 10, the semiconductor elements 4 and the wire bonds 6 are covered with the molding resin 8, whereas the external terminal communication parts 5 are provided to stand on the wiring pattern 3 so as to pass through the molding resin 8. The molding resin 8 seals the semiconductor elements 4 and the wire bonds 6 and also functions as a housing for holding the metal substrate 10, the semiconductor elements 4, the external terminal communication parts 5, and the wire bonds 6. In addition, the molding resin 8 serves to secure the insulation between respective components on the metal substrate 10.

The sleeve board 7 made of a thermoplastic resin, which is disposed to face the surface of the metal substrate 10 on which the semiconductor elements 4 are mounted and includes a plurality of openings 7a (sleeves) for exposing the external terminal communication parts 5, is disposed on the molding resin 8. As shown in FIG. 2, the upper surface of the semiconductor device 100 is entirely covered with the sleeve board 7 except for the portions corresponding to the openings 7a through which the external terminal communication parts 5 are exposed. This configuration is made by filling the molding resin 8 between the metal substrate 10 and the sleeve board 7.

As shown in FIG. 1, the molding resin 8 extends so as to cover the side surfaces of the metal substrate 10. On the side surfaces of the metal substrate 10, the molding resin 8 covers outer edges of the insulating sheet 2 and the wiring pattern 3. Accordingly, the insulating sheet 2 and the wiring pattern 3 are not exposed from the molding resin 8 on the side surfaces of the metal substrate 10. While the molding resin 8 covers most portions of the side surfaces of the metal base plate 1, the metal base plate 1 includes a projecting portion 1a in lower portions of the side surfaces (edge portions of the lower surface), and the projecting portion 1a is exposed from the molding resin 8 on the side surfaces of the metal substrate 10.

The insulating sheet 2 is generally composed of an inorganic filler having excellent thermal conductivity and an organic component. It is feared that the insulating sheet 2 of this type may be deteriorated due to moisture because of hygroscopicity thereof. In this preferred embodiment, however, the insulating sheet 2 is completely sealed with the molding resin 8 and is not exposed to the outside, and thus, the insulating sheet 2 is prevented from being deteriorated due to moisture. Therefore, the insulation between the wiring pattern 3 and the metal base plate 1 can be secured sufficiently. This enables to make the insulating sheet 2 thinner, which is conducive to downsizing of the semiconductor device 100.

Similarly, the wiring pattern 3 is also completely sealed with the molding resin 8 and is not exposed to the outside, so that the interface between the wiring pattern 3 and the molding resin 8 is not exposed to the outside. This prevents the degradation in insulating property of the molding resin 8 due to the moisture infiltrating from the interface.

Further, the insulating sheet 2 and the wiring pattern 3 are completely sealed with the molding resin 8, whereby it is possible to prevent peeling-off between the metal base plate 1 and the insulating sheet 2 and peeling-off between the insulating sheet 2 and the wiring pattern 3 that are caused by mechanical vibrations. This leads to an effect that the insulating property between the wiring pattern 3 and the metal base plate 1 (caused by the molding resin 8) is prevented from being deteriorated.

The metal base plate 1 has an outer diameter equal to the outer diameter of the semiconductor device 100 including the projecting portion 1a, and thus, is capable of efficiently diffusing the heat generated from the semiconductor elements 4. Preferable examples of the material for the metal base plate 1 include copper, copper alloyed metals and aluminum. It suffices that aluminum is used in a case of emphasizing the reductions of cost as well as size, and copper or copper alloyed metals are used in a case of emphasizing the heat dissipation property.

According to this preferred embodiment, the semiconductor device 100 having high reliability can be obtained as described above. Further, the semiconductor device 100 is formed by a batch transfer molding process as described below, which is also conducive to reductions in size and cost of a semiconductor device.

The semiconductor element 4 mounted in the semiconductor device 100 may be formed of silicon (Si) as in a conventional case, and more preferably, is formed of a wide bandgap semiconductor such as silicon carbide (SiC). An element formed of a wide bandgap semiconductor has excellent thermal resistance, and thus, the operation temperature of the semiconductor element 4 can be increased. For this reason, even if the insulating sheet 2 takes up moisture, the moisture is dissipated to the outside owing to the heat generated when the semiconductor element 4 operates at high temperature. Examples of the wide bandgap semiconductor include gallium nitride (GaN)-based materials and diamond, in addition to SiC.

The semiconductor device 100 according to this preferred embodiment is formed by a batch transfer molding process. That is, each individual semiconductor device 100 is formed by cutting the structure in which a plurality of semiconductor devices 100 are integrally formed through dicing. The semiconductor device 100 before singulation is connected to the adjacent semiconductor device 100 via the projecting portion 1a of the metal base plate 1, as shown in FIG. 4.

Figure 4:
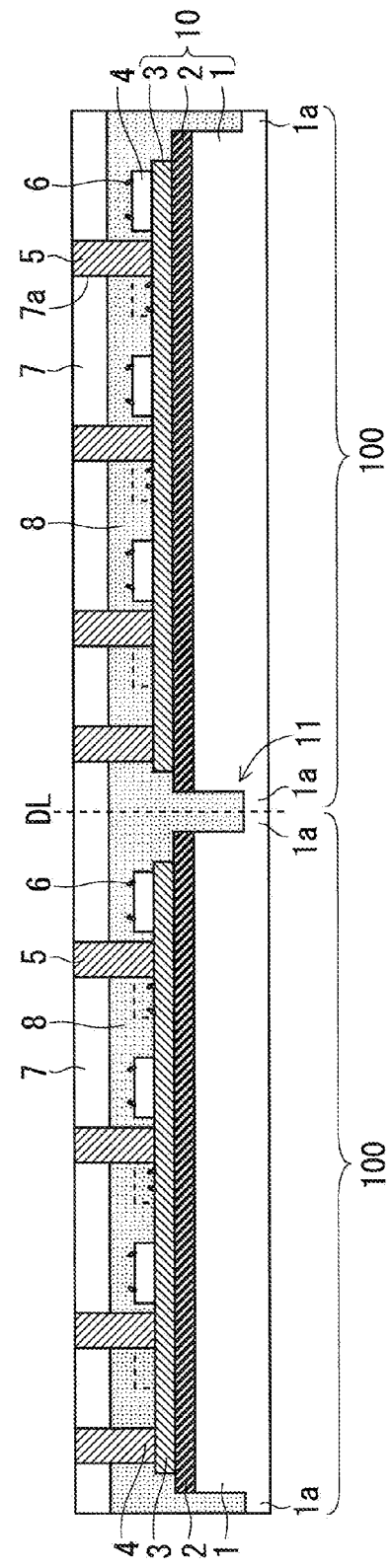
FIG. 4 is a cross-sectional view showing a state before singulation of the semiconductor device according to the first preferred embodiment.

As shown in FIG. 4, in the state before the singulation of the semiconductor device 100, a line-shaped trench 11 (recess) corresponding to a dicing line DL (cutting line) between the semiconductor devices 100 is formed in the metal substrate 10. The trench 11 penetrates through the wiring pattern 3 and the insulating sheet 2 and into the metal base plate 1, and the molding resin 8 is filled inside thereof. The two semiconductor devices 100 are cut at the center portion of the trench 11 of the metal substrate 10. Accordingly, the molding resin 8 remains on the side surface (cut surface) of each of the semiconductor devices 100, and the projecting portion 1a exposed from the molding resin 8 is formed on the side surface of the metal base plate 1.

Hereinafter, a method of manufacturing the semiconductor device 100 according to this preferred embodiment is described.

First, the metal substrate 10 for forming a plurality of semiconductor devices 100 (formed by integrally forming, the metal substrates 10 for the plurality of semiconductor devices 100) each composed of the metal base plate 1, the insulating sheet 2, and the wiring pattern 3 is prepared. Then, the line-shaped trenches 11 are formed so as to extend along dicing lines DL in singulation of the semiconductor devices 100. The trench 11 is formed to penetrate through the wiring pattern 3 and the insulating sheet 2 and into the metal base plate 1.

The trench 11 can be formed by a router or the like. Depending on the thickness, material and size of the metal base plate 1, the trench 11 preferably has a depth so as to penetrate into the metal base plate 1 as deep as possible. Too deep trench 11 may result in that the metal base plate 1 is broken or bent when being handled. Therefore, it suffices that the depth of the trench 11 is appropriately adjusted in accordance with the specifications of a transportation system of a manufacturing device.

In order to cause the molding resin 8 to remain on the side surfaces of the metal base plate 1 also after cutting the metal substrate 10, the width of the trench 11 needs to be set larger than the width of the dicing line DL. The width of the trench 11 corresponds to the width of the blade of the router or the like used for forming the trench 11, and the width of the dicing line DL corresponds to the width of the blade of the router or the like used in dicing. That is, it suffices that in this preferred embodiment, the blade having the width larger than that of the blade of the router or the like used in dicing is used as the blade of the router or the like used in processing the trench 11.

After that, the semiconductor elements 4 and the external terminal communication parts 5 are mounted on the metal substrate 10 using a conductive bonding material such as solder, and then, wiring is provided for connecting the wiring pattern 3, the semiconductor elements 4, and the external terminal communication parts 5 using the wire bonds 6. FIG. 5 is a plan view of the semiconductor device 100 after the above-mentioned wiring step. It is shown that the trenches 11 are formed into lines along the dicing lines DL.

Figure 6:
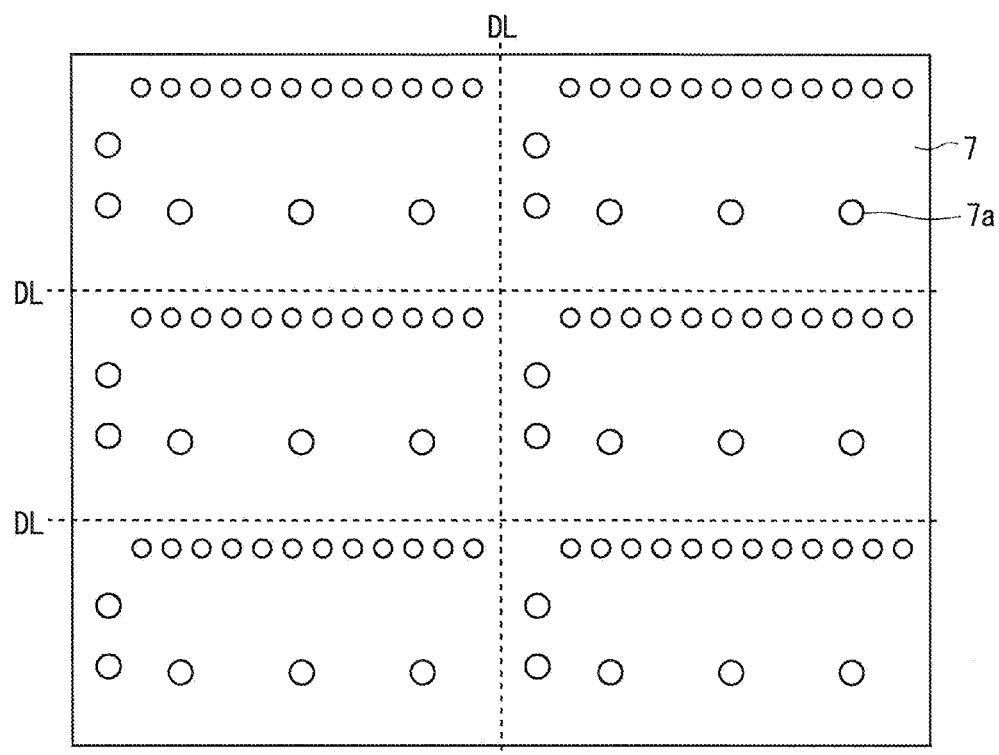
Figure 8:
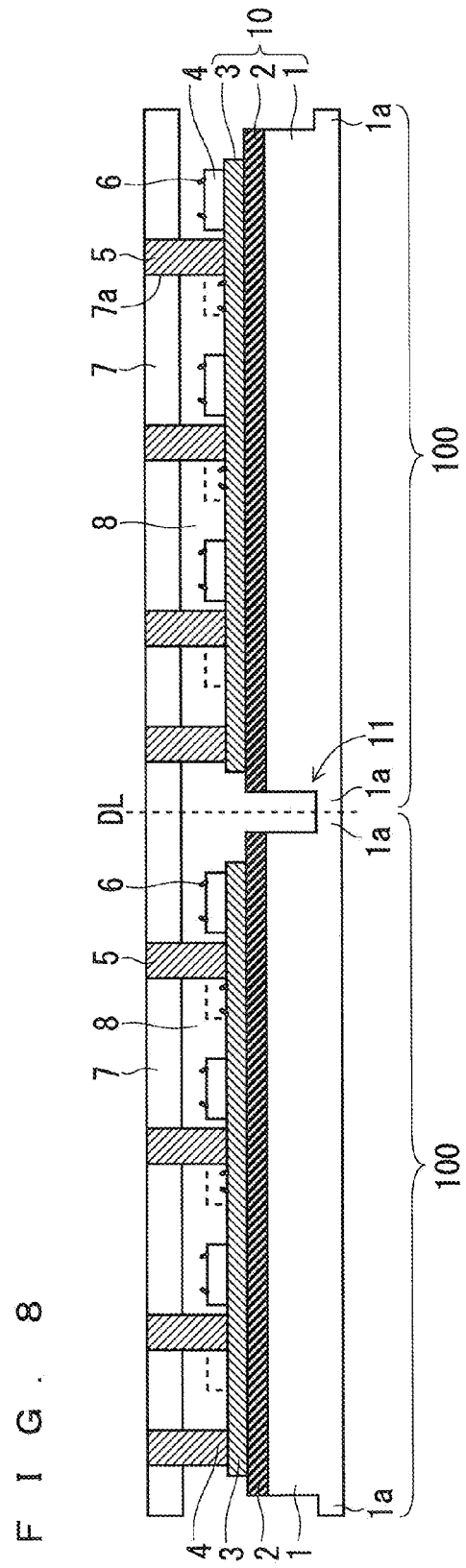

Wiring is provided using the wire bonds 6, and then, the sleeve board 7 (plate-like member) formed of a thermoplastic resin is mounted to be opposed to the surface of the metal substrate 10 on which the semiconductor elements 4 are mounted. FIG. 6 is a plan view of the sleeve board 7. FIG. 7 is a top view of the semiconductor device 100 when the sleeve board 7 is disposed to be opposed to the metal substrate 10 (before singulation), and FIG. 8 is a cross-sectional view thereof When the sleeve board 7 is mounted onto the metal substrate 10, the external terminal communication parts 5 are fitted into the openings 7a of the sleeve board 7 as shown in FIG. 8. Then, as shown in FIG. 7, the external terminal communication parts 5 are exposed from the upper surface of the semiconductor device 100 through the openings 7a.

Then, the molding resin 8 is filled between the metal substrate 10 and the sleeve board 7. As a result, the semiconductor elements 4 and the wire bonds 6 are sealed with the molding resin 8. On this occasion, the molding resin 8 is also filled into the trenches 11 of the metal substrate 10. The molding resin 8 filled in the trenches 11 covers the side surfaces of the metal substrate 10 in the semiconductor devices 100 after singulation.

Finally, the sleeve board 7, the molding resin 8, and the metal substrate 10 are cut along the dicing lines DL, so that the semiconductor devices 100 are singulated (diced). As a result, a plurality of semiconductor devices 100 shown in FIG. 1 are obtained.

The above-mentioned dicing step can also be performed using a router or the like. The blade of a router or the like cuts the portions of the trenches 11 (that is, thin portions of the metal base plate 1), and accordingly, the thickness of the metal cut by the router or the like becomes smaller, which makes cutting easier. Further, the blade of a router or the like is less likely to wear out in cutting of the sleeve board 7 formed of a thermoplastic resin and is cut more easily compared with cutting of the molding resin 8. Therefore, the thickness of the molding resin 8 cut by a router or the like can be made smaller by disposing the sleeve board 7 as the upper portion of the semiconductor device 100. This makes cutting easier, and the blade of a router or the like is less likely to wear out.

As described above, a blade having a width smaller than the width of the trench 11 of the metal substrate 10 is used as the blade of a router or the like used in this dicing step. This is because in other cases, the molding resin 8 in the trench 11 is all removed in dicing, and the side surfaces of the metal substrate 10 are not covered with the molding resin 8 in the semiconductor device 100 after singulation, so that the edges of the insulating sheet 2 and the wiring pattern 3 may be exposed. In such cases, the effects of the present invention are reduced, leading to degradation in reliability of the semiconductor device 100. In addition, an increase in width of the dicing line incurs a reduction of the number of semiconductor devices 100 to be obtained, leading to an increase of manufacturing cost.

Accordingly, in this preferred embodiment, the width of the router or the like used in dicing is made smaller than that of the trench 11 of the metal substrate 10. Note that an extremely thin blade may reduce the life of the blade and make the dicing line meander, and thus it is desired to optimize the width and material of the blade in consideration of the above.

While FIG. 5 shows the mode in which a total of six semiconductor devices 100, two horizontally and three vertically, are collectively formed, an appropriate number thereof may be formed.

Second Preferred Embodiment

Figure 9:
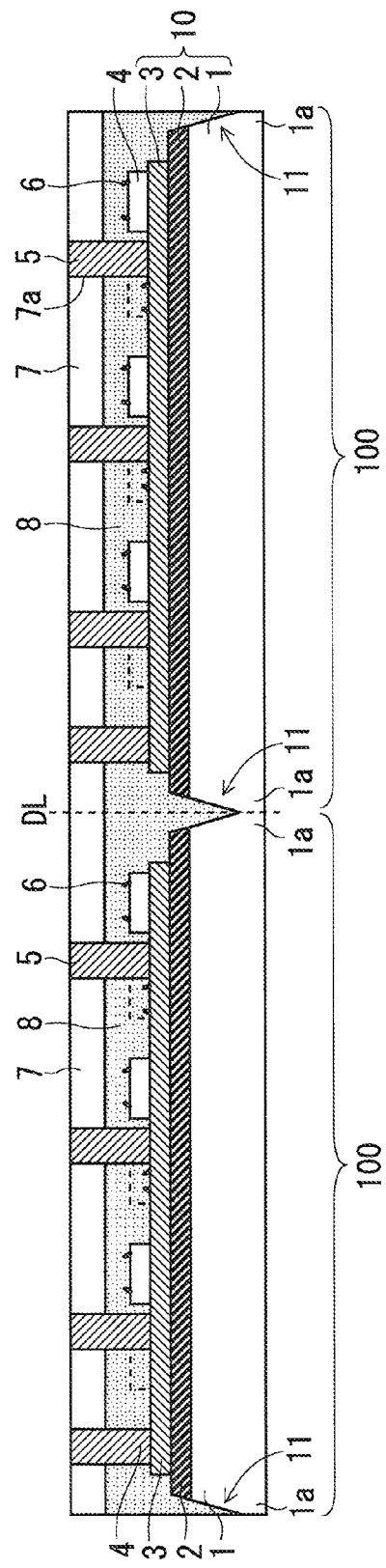
FIG. 9 is a view for describing the configuration of a semiconductor device according to a second preferred embodiment and a method of manufacturing the same.

While the trench 11 formed in the metal substrate 10 has a square groove shape (the cross section has a square-U-shape (squarely-cornered-U-shape)) in the first preferred embodiment, the cross-sectional shape of the trench 11 is determined in accordance with the shape of the blade of the router or the like used for forming the trench 11. For example, the trench 11 may be a V-shaped trench (may have a V-shaped cross section) or U-shaped trench (may have a U-shaped cross section). FIG. 9 shows an example in which the trenches 11 having a V-shape are formed in the metal substrate 10 before singulation.

Note that in consideration of, for example, the dimensional accuracy in dicing of the semiconductor device 100, a square-shaped trench, and further, a U-shaped trench do not require alignment accuracy as high as a V-shaped trench in the cutting step, and thus dicing can be performed more easily.

Third Preferred Embodiment

Figure 10:
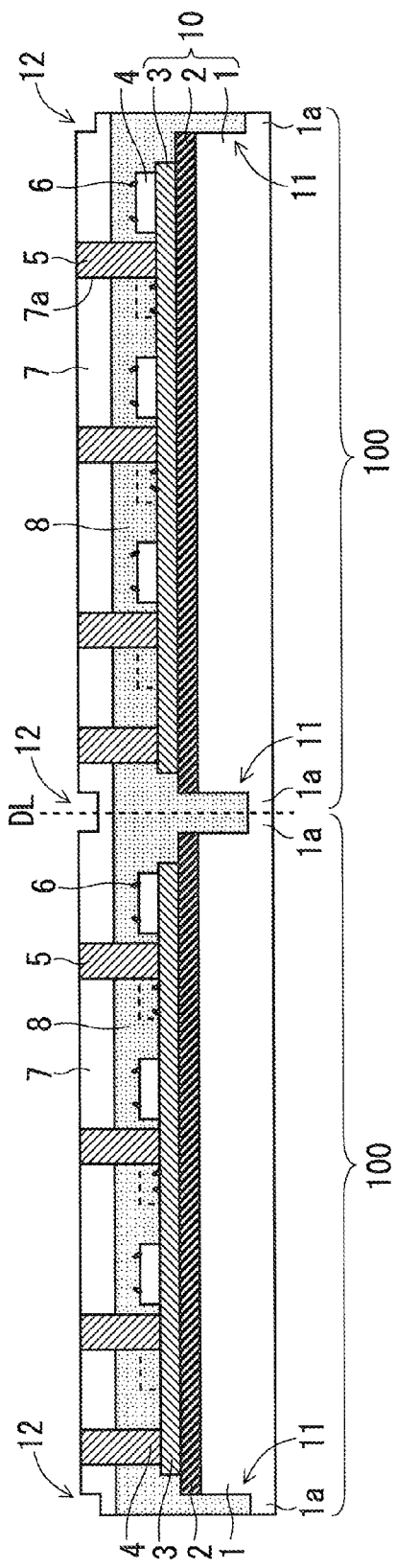
FIGS. 10 and 11 are views for describing the configuration of a semiconductor device according to a third preferred embodiment and a method of manufacturing the same.
Figure 11:
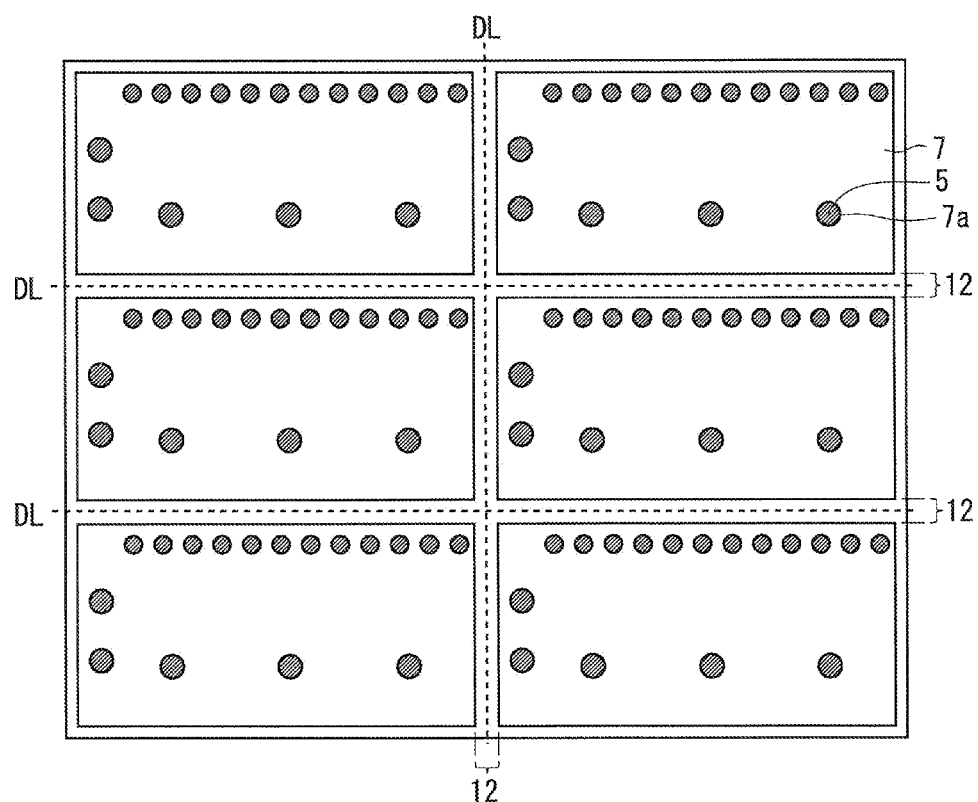

FIGS. 10 and 11 are views for describing the configuration of a semiconductor device according to a third preferred embodiment and a method of manufacturing the same, FIG. 10 is a cross-sectional view showing the state before the singulation of the semiconductor device 100 according to the third preferred embodiment, and FIG. 11 is a top view thereof.

In this preferred embodiment, line-shaped trenches 12 are formed so as to extend along the dicing lines DL also in the sleeve board 7 disposed as the top surface portion of the semiconductor device 100. The width of the trench 12 provided in the sleeve board 7 is made larger than the width of the blade used in dicing for singulation of the semiconductor device 100.

Accordingly, in dicing of the semiconductor device 100, the portion cut by a router or the like has a smaller thickness, and thus, the cut area thereof can be made smaller. This further improves the cutting speed in dicing and reduces wear-out of a cutting blade, contributing to a manufacturing cost reduction.

The preferred embodiments of the present invention can be freely combined or can be appropriately modified or omitted without departing from the scope of the present invention.

What is claimed is:

1. A method of manufacturing a semiconductor device, comprising the steps of:
   (a) preparing a substrate including a metal base plate, an insulating sheet disposed on said metal base plate, and a wiring pattern disposed on said insulating sheet;
   (b) mounting semiconductor elements on said substrate;
   (c) forming a molding resin covering said semiconductor elements on said substrate, including:
      (c-1) disposing a plate-like member of a thermoplastic resin to be opposed to a surface of said substrate on which said semiconductor elements are mounted, the plate-like member including at least one opening through which an external terminal communications part is exposed; and
      (c-2) filling said molding resin between said substrate and said plate-like member; and
   (d) after said step (c), cutting said molding resin and said substrate to cut out a plurality of semiconductor devices on which said semiconductor element is mounted, wherein
   a trench is pre-formed in said substrate so as to extend along a cutting line in said step (d), said trench having a width larger than a width of said cutting line and passing through said wiring pattern and said insulating sheet into said metal base plate, and
   in said step (c), said molding resin is filled inside said trench.

2. The method of manufacturing a semiconductor device according to claim 1, wherein a blade used in cutting said molding resin and said substrate in said step (d) has a width smaller than the width of said trench.

3. The method of manufacturing a semiconductor device according to claim 1, wherein said trench has a cross section of any one of a square-U-shape, a V-shape, and a U-shape.

4. A method of manufacturing a semiconductor device comprising the steps of:
   (a) preparing a substrate including a metal base plate, an insulating sheet disposed on said metal base plate, and a wiring pattern disposed on said insulating sheet;
   (b) mounting semiconductor elements on said substrate;
   (c) forming a molding resin covering said semiconductor elements on said substrate, including:
      (c-1) disposing a plate-like member of a thermoplastic resin to be opposed to a surface of said substrate on which said semiconductor elements are mounted; and
      (c-2) filling said molding resin between said substrate and said plate-like member; and
   (d) after said step (c), cutting said molding resin and said substrate to cut out a plurality of semiconductor devices on which said semiconductor element is mounted, wherein
   a trench is pre-formed in said substrate so as to extend along a cutting line in said step (d), said trench having a width larger than a width of said cutting line and passing through said wiring pattern and said insulating sheet into said metal base plate,
   in said step (c), said molding resin is filled inside said trench, and
   a trench having a width larger than the width of the cutting line in said step (d) is pre-formed in said plate-like member so as to extend along said cutting line.

5. The method of manufacturing a semiconductor device according to claim 4, wherein a blade used in cutting said molding resin and said substrate in said step (d) has a width smaller than the width of said trench of said plate-like member.

* * * * *